(12) United States Patent
Kirkwood et al.

(10) Patent No.: US 10,689,752 B2
(45) Date of Patent: Jun. 23, 2020

(54) FILM STABILIZATION THROUGH NOVEL MATERIALS MODIFICATION OF BEAMLINE COMPONENTS

(71) Applicant: Axcelis Technologies, Inc., Beverly, MA (US)

(72) Inventors: David A. Kirkwood, Arlington, MA (US); Joseph F. Valinski, Newmarket, NH (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 16/192,838

(22) Filed: Nov. 16, 2018

(65) Prior Publication Data

US 2019/0144991 A1 May 16, 2019

Related U.S. Application Data

(60) Provisional application No. 62/587,075, filed on Nov. 16, 2017.

(51) Int. Cl.
| | |
|---|---|
| *C23C 14/48* | (2006.01) |
| *H01J 37/00* | (2006.01) |
| *H01J 37/317* | (2006.01) |
| *H01L 21/265* | (2006.01) |

(52) U.S. Cl.
CPC .......... *C23C 14/48* (2013.01); *H01J 37/3171* (2013.01); *H01L 21/265* (2013.01)

(58) Field of Classification Search
CPC ..... C23C 14/48; H01J 37/3171; H01L 21/265
USPC .... 250/492.1, 492.2, 492.21, 492.22, 492.23
See application file for complete search history.

(56) References Cited

U.S. PATENT DOCUMENTS

2013/0108863 A1* 5/2013 Cooke ................. H01J 37/16
428/336

* cited by examiner

*Primary Examiner* — Nicole M Ippolito
(74) *Attorney, Agent, or Firm* — Eschweiler & Potashnik, LLC

(57) ABSTRACT

An electrically conductive component is provided for a near-wafer environment of an ion implantation system, where the component has a carbon-based substrate having a microscopically textured surface overlying a macroscopically textured surface. The macroscopically textured surface is a mechanically, chemically, or otherwise roughened surface. The microscopically textured surface can be a converted surface formed by a chemical reaction forming a non-stoichiometric silicon and carbon surface. The one or more components can be a dose cup, exit aperture, and tunnel wall. The carbon-based substrate can be graphite. The microscopically textured surface can be a modified graphite surface. No defined interface layer exists between the microscopically textured surface and macroscopically textured surface. The carbon-based graphite is selected based on a final porosity and grain size of the graphite.

20 Claims, 3 Drawing Sheets

FILM STABILIZATION THROUGH NOVEL MATERIALS MODIFICATION OF BEAMLINE COMPONENTS

REFERENCE TO RELATED APPLICATIONS

This application is a U.S. Non-Provisional Application which claims the benefit of U.S. Provisional Application Ser. No. 62/587,075 filed Nov. 16, 2017, entitled "FILM STABILIZATION THROUGH NOVEL MATERIALS MODIFICATION OF BEAMLINE COMPONENTS", the contents of which are herein incorporated by reference in their entirety.

TECHNICAL FIELD

The present invention relates generally to ion implantation systems, and more specifically to systems, apparatuses, and methods for stabilizing films formed on beamline components in an ion implantation system.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Graphite liners are commonly used throughout the ion implanter for a plurality of reasons, one of the most common being to shield the vacuum system from being struck and damaged by the ion beam. Graphite liners are commonly placed in the vicinity of the wafer plane, and are versatile, in that they can be produced with high purity and manufactured into complex shapes that allow the beamline to be designed free from constraints imposed by the liner material.

Graphite liners, however, tend to suffer from several inherent issues. For example, graphite material can be eroded from the graphite liner by the ion beam, thus causing a need for frequent replacement. Such erosion of the graphite liner may arise through physical or chemically-enhanced sputtering, or through thermal ion beam milling. Further, the graphite liner can be coated by back-sputtered material from the target substrate or from other terminating surfaces (e.g., a tuning Faraday) struck by the ion beam. Such coatings tend to develop a film of material that will, over time, delaminate and cause particle excursions on the workpiece.

Conventionally, such problems are mitigated by densifying surfaces of the graphite liner in an effort to improve a lifetime of the graphite liner. However, such a densification of the surfaces generally does not reduce the amount of material liberated from the surfaces. Other conventional mitigations include roughening the surface(s) through mechanical means. However, such roughening is not usable on all surfaces, and can further result in particles being trapped in the roughened surface.

SUMMARY

The present disclosure advantageously overcomes the limitations of the prior art by providing a system, apparatus, and method for stabilizing films formed on components of a beamline of an ion implantation system. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the disclosure in a simplified form as a prelude to the more detailed description that is presented later.

According to one exemplary aspect of the disclosure, a component for an ion implantation system is provided, wherein in one example, the component is positioned in a near-wafer environment of the ion implantation system. The near-wafer environment, for example, is downstream of an angular energy filter and within approximately 10 cm of a workpiece plane associated with the workpiece. For example, the component comprises one or more of a dose cup, exit aperture, and a tunnel wall associated with a beamline of the ion implantation system.

The component, for example, comprises a carbon-based substrate having a microscopically textured surface overlying a macroscopically textured surface. In one example, the macroscopically textured surface comprises a mechanically, chemically, or otherwise roughened surface. In another example, the microscopically textured surface comprises a chemically converted surface. According to another example of the present disclosure, no defined interface layer is present between the microscopically textured surface and macroscopically textured surface.

According to another example, the microscopically textured surface comprises a converted surface. The converted surface, for example, is formed by a chemical reaction forming a non-stoichiometric silicon and carbon surface. The carbon-based substrate may comprise graphite. The microscopically textured surface, for example, may thus comprise a modified graphite (MG) surface. The carbon-based substrate, for example, may be selected based on a final porosity and grain size of the graphite.

In accordance with another exemplary aspect, a method for forming a component for an ion implantation system is provided. The method, for example, comprises providing a carbon-based substrate having a surface. One or more regions of the surface of the substrate are macroscopically textured. Macroscopically texturing the one or more regions of the surface, for example, comprises selectively mechanically, chemically, or otherwise roughening the one or more regions of the surface.

Further, after macroscopically texturing the one or more regions of the surface of the substrate, the surface of the substrate is microscopically textured. Microscopically texturing the surface, for example, may comprise chemically converting all of the surface. In another example, microscopically texturing the surface comprises forming a modified graphite (MG) surface. In yet another example, microscopically texturing the surface comprises a chemical reaction forming a non-stoichiometric silicon and carbon surface.

The present disclosure thus contemplates a chemical conversion of a graphite surface of a graphite liner in order to result in a non-stoichiometric skin material, thus overcoming the shortcomings seen with conventional mitigations. Such a chemical conversion further results in a liner material having advantages of low weight and machining ability of the graphite material, while having superior film retention and erosion lifetime characteristics. The graphite liner of the present disclosure, being chemically converted, provides a low cost and fast lead time for manufacture, while exhibiting a significantly longer lifetime and improved performance over conventional liners.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

Figure 1:
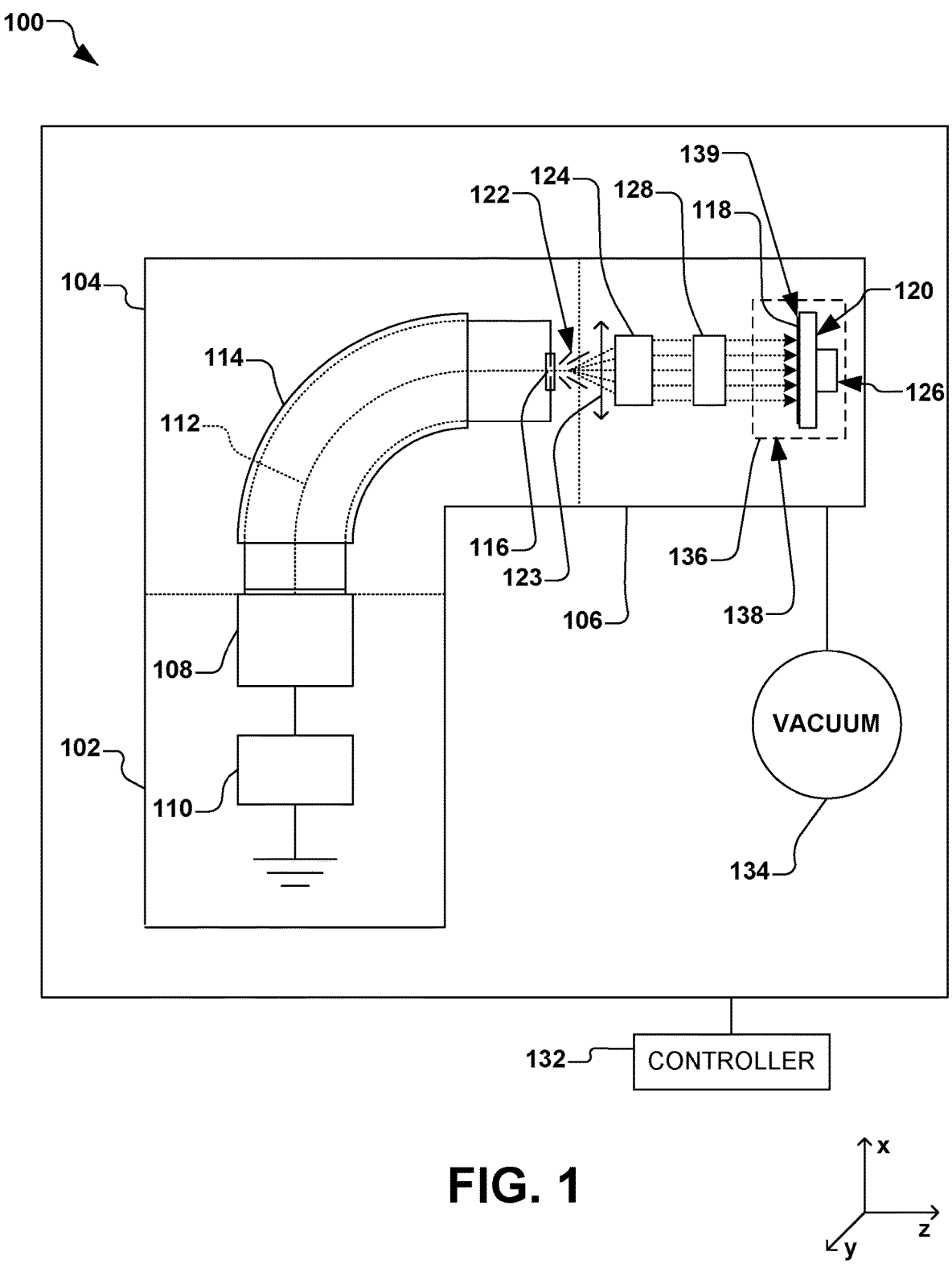
FIG. 1 is a block diagram of an exemplary vacuum system in accordance with several aspects of the present disclosure.

The present disclosure is directed generally toward systems and methods for ion implantation including various components having modified surfaces configured for minimizing formation of films and/or cleaning of films formed on the components. More particularly, the present disclosure is directed toward systems, apparatuses, and methods for prevention, stabilization and/or removal of films formed on components in an environment near a workpiece being implanted, whereby a modification of one or more surfaces of the components aids in the prevention, stabilization and/or removal of said films. In particular, the components may comprise components in a drift or field-free region of the ion implantation system, such as a dose cup, exit aperture, tunnel walls, etc. in a near-wafer environment proximate to a workpiece region of a beamline of the ion implantation system.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features, circuits, or elements in one embodiment, and may also or alternatively be fully or partially implemented in a common feature, circuit, or element in another embodiment. For example, several functional blocks may be implemented utilizing a common feature, circuit, or element. It is further to be understood that any connection which is described as being wire-based in the following specification may also be implemented as a wireless communication, unless noted to the contrary.

Referring now to the figures, in accordance with one aspect of the present disclosure, FIG. 1 illustrates an exemplary ion implantation system 100. The ion implantation system 100, for example, comprises a terminal 102, a beamline assembly 104, and an end station 106. Generally speaking, an ion source 108 in the terminal 102 is coupled to a power supply 110 to ionize a dopant gas into a plurality of ions and to form an ion beam 112. The ion beam 112 in the present example is directed through a mass analyzer 114, and out an aperture 116 towards the end station 106. In the end station 106, the ion beam 112 impacts a workpiece 118 (e.g., a semiconductor workpiece such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure. In a preferred embodiment, the ion beam 112 comprises a spot beam, wherein the spot beam is scanned via a beam scanner 122 positioned downstream of the aperture 116. The beam scanner 122, for example, electrostatically or magnetically scans the ion beam 112 along a first axis 123 (e.g., in the x-direction), wherein a plurality of beamlets of the ion beam can be further parallelized downstream of the beam scanner via a parallelizer 124. Furthermore, a workpiece scanner 126 can be utilized to scan the workpiece through the scanned ion beam 112 (e.g., the workpiece 118 is mechanically scanned in the y-direction).

An angular energy filter (AEF) 128 may be further provided in the ion implantation system 100. The AEF 128, for example, may comprise one or more features provided in the Purion Ion Implantation System manufactured by Axcelis Technologies, Inc. of Beverly, Mass. The AEF 128, for example, is configured to receive the scanned and parallel ion beam 112 and subsequently deflect the ion beam from an incoming beamline axis along a second axis (e.g., in the vertical or y-direction).

Furthermore, a controller 132 is provided and operable to control some or all of the system 100, such as the AEF 128, beam scanner 122, and/or various other components of the ion implantation system based on the implantation desired. A vacuum source 134 (e.g., a vacuum pump) is further provided for evacuating the system 100.

Particulate contamination in the system 100 may deleteriously affect the workpiece 118, whereby the contamination may alter the desired characteristics of the workpiece. One of the primary sources of particulate contamination in the ion implantation 100 arises from a delamination of thin films formed on one or more components 136 (e.g., a dose cup, exit aperture, tunnel walls, etc.) in a so-called near-wafer environment (NWE) 138 proximate to the workpiece 118. In particular, the one or more components 136 may be downstream of the AEF 128. In one example, the near wafer environment 138 may be anywhere from the last energized beamline electrodes to a substrate plane 139 (e.g., a drift region or field free region). Absent countermeasures, such components 136 may rapidly become prone to film delamination through interaction with the ion beam 112. The near-wafer environment 138, for example, may be a location within approximately 10 cm of the substrate plane 139 of the workpiece 118.

The thin films on the components 136, for example, may be generated through back-sputtering of coatings (not shown) on the workpiece 118 or the workpiece, itself, as well as from graphite forming some of the components 136 in the vacuum system, whereby the thin films are heavily doped with the implant species. Delamination of the thin films may occur when the stresses associated with the bond between the thin films and components 136 grows beyond a critical level, whereby the thin films have a tendency to flake off the components and contaminate the workpiece 118. The delamination of the thin films can be accelerated when in close proximity to the ion beam 112, whereby the ion beam may cause thermal cycling between the component 136 and the thin film, thus increasing a likelihood of increasing the stresses. For example, thermal cycling associated with heating and cooling of the films and underlying components 136 may lead to differences in thermal expansion, which, in turn, can lead to film delamination from the components.

The one or more components 136 may be comprised of textured virgin graphite; however, the textured virgin graphite can result in graphitic dust, which is a potential contamination source. Further, the effect of texturing on film stress may not produce an adequate lifetime for the one or more components when the one or more components are formed only of textured virgin graphite. The one or more components 136 may also be comprised textured vitrified graphite, however vitrified graphite may become electrically insulating and can cause further problems during the operation of the system 100.

Thus, in accordance with one exemplary aspect of the disclosure, the one or more components 136 of the present disclosure may comprise a modified graphite configured to protect beamline components, and wherein components such as graphite liners may be textured or smooth. The present disclosure appreciates that components 136 made of a particular material (e.g., virgin, unadulterated graphite) may have a propensity to shed small particles when exposed to the ion beam 112. Such particle shedding is a concern and increasingly problematic when smaller and smaller particle sizes are present in the near wafer environment 138. Film delamination in the near wafer environment 138 is a primary source of particle excursions that may be caused by back-sputtered material coating the liners or other surfaces in the near wafer environment, and may further cause subsequent delamination through film stress or thermal cycling.

Figure 2:
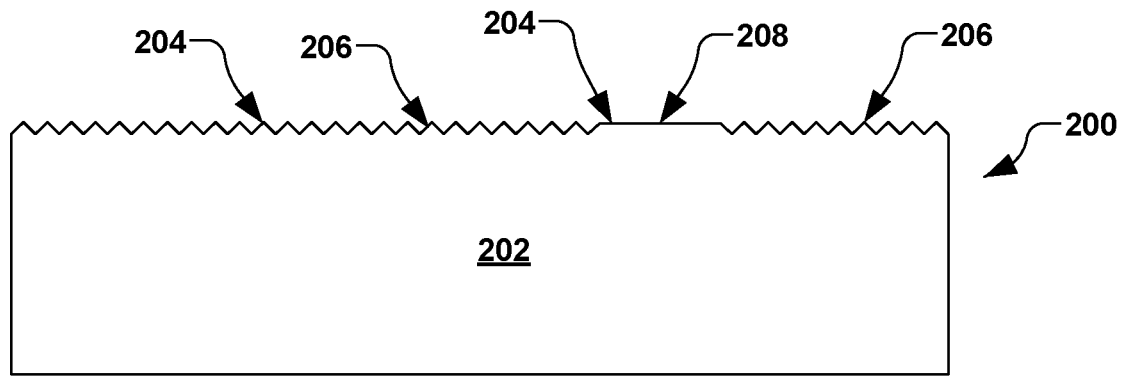
FIG. 2 is a schematic representation of an exemplary component having a macroscopically roughened surface in according with several aspects of the present disclosure.

The present disclosure thus utilizes a variety of techniques to mitigate issues with particle contamination from the one or more components 136 in the near wafer environment 138. The one or more components 136, in accordance with one particular example, are electrically conductive. The one or more components 136, for example, may comprise a component 200 as illustrated in FIG. 2. The component 200, for example, comprises a graphite substrate 202, whereby a surface 204 of the component is selectively macroscopically textured (e.g., mechanically, chemically, or otherwise roughened) to define a macroscopically textured surface 206. A mechanically produced macroscopically textured surface 206, for example, defined grooves having a depth and width on the order of tenths of a millimeter. In the present example, one or more regions 208 of the surface 204 may be masked or otherwise prevented from being macroscopically textured. For example, the one or more regions 208 of the surface 204 may mate with other surfaces or apertures, whereby a smooth finish is desirable for such adequate mating of said surfaces. In accordance with the present disclosure, the surface 204 of the component 200 further undergoes a conversion process to form a converted surface 210 shown in FIG. 3. The converted surface 210, for example, comprises a microscopically textured non-stoichiometric silicon carbide (SiC) modified material 212, whereby the surface 204 of the component is thus configured to generate fewer particle contaminants, thereby enhancing a lifetime and performance of shielding in the near wafer environment 138 of FIG. 1.

Figure 3:
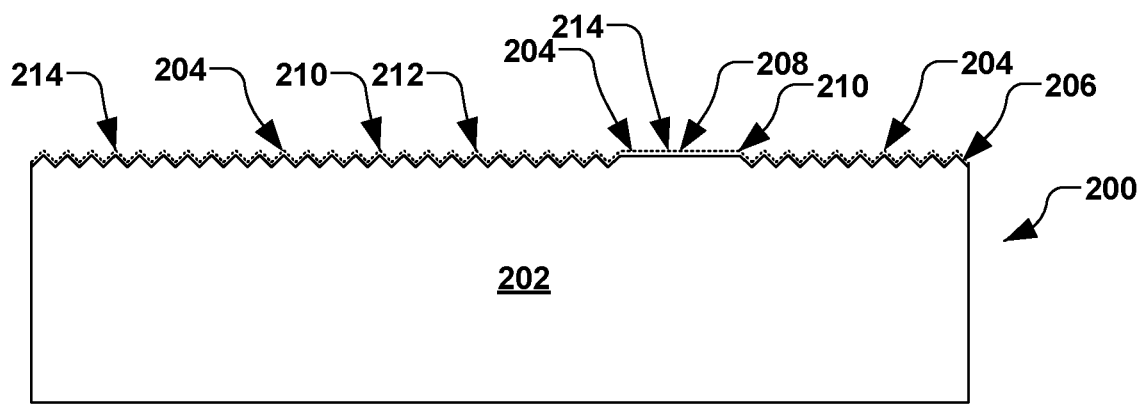
FIG. 3 is a schematic representation of an exemplary component having a macroscopically roughened surface and microscopically roughened surface in according with several aspects of the present disclosure.

To form the converted surface 210 (e.g., a microscopically textured surface whereby irregularities in the grain structure of the surface 204 are on the micron scale) of FIG. 3, for example, the present disclosure contemplates a chemical reaction forming a modified graphite (MG) surface 214, such as a non-stoichiometric silicon and carbon surface (e.g., a conversion process such as a high temperature and high pressure process using a silicon-containing forming gas), whereby the MG surface is microscopically textured. The MG surface 214 further benefits from the macroscopic surface roughness of the macroscopically textured surface 206. Accordingly, the surface 204 that results is contemplated to advantageously withstand rapid heating in an implanter environment, whereby particle contamination from particle shedding caused by thermal cycling is advantageously reduced. For example, advantages are achieved via an increase in surface area of the surface 204 afforded by the macroscopic roughness of the macroscopically textured surface 206, while being coupled to improved thermal responsiveness of the chemically modified material of the converted surface 210 or MG surface 214.

The present disclosure contemplates application in any surface 204 of any component 136 positioned in the near-wafer environment 138 of FIG. 1. The conversion process of the surface 204 described herein may advantageously enhance the surface to increase longevity properties. A lifetime of the component 136 is principally determined by the interval between preventative maintenance activities, which are triggered by the onset of film delamination from, or excessive erosion of, material in the near-wafer environment 138. The present disclosure thus delays onset of delamination or erosion (e.g., an erosion beyond a predetermined depth), thus increasing the lifetime of the component. The present disclosure contemplates the graphite substrate 202 of FIGS. 2-3, for example, comprising various grades of graphite, such as T-5 or, CX-80 manufactured by Ibiden Co., LTD. The present disclosure thus contemplates selecting the type of graphite for the starting substrate 202 to give different final porosity and grain size of the graphite.

The bulk substrate 202 of the component 200, for example, may comprise a specific type of graphite that is exposed to a chemical conversion, whereby a non-stoichiometric silicon carbide layer is formed or defined on the surface 204, whereby no defined interface layer is present between the surface 204 and the bulk substrate. In one example, the bulk substrate 202 of the present disclosure is subjected to rapid temperature increases followed by slow radiative cooling. In conventional measurement of thermal stability, one slowly increases the temperature followed by rapid quench cooling. However, such a slow heating and rapid cooling is not representative of operation inside of an ion implanter, where rapid heating may be and slow cooling may be experienced by the component 200. The component 200, for example, is thus configured to advantageously withstand thermal shock as the ion beam scans over the component 136. The graphite grains inside the silicon carbide of the component 136 provides advantageous electrical conductivity that is better than conventionally seen with undoped SiC. It is noted that doped SiC is not a desirable feature to have in a substrate near in the near-wafer environment 138 of FIG. 1, as this has the potential to counter-dope or otherwise deleteriously affect the workpiece 118 in the event of ion induced damage.

This present disclosure utilizes various graphite or carbon-based materials having a surface that is chemically converted (e.g., no coating is applied). Whereas a coating implies a deposition, the present disclosure provides at least a partial chemical conversion of a surface that does not form a defined interface layer. A tunable thickness of the converted layer and degree to which it is defined, as well as an appropriate starting substrate may be tailored to the particular component 136 and its associated location and/or usage in the system of FIG. 1. For example, various components 136 may have different uses or locations in the system 100 and may be tailored appropriately. A component 136 that is struck by the ion beam in an orthogonal manner, for example, may be more sputter resistant and harder that other components not struck by the ion beam in such a manner. Other components 136 may have greater incidence angles of beam strike from the ion beam 112, whereby the other components can be less hard, but be rougher, and with better conductivity. The present disclosure thus provides for a novel tailoring of the both the starting substrate and substrate surface finish.

For example, the present disclosure contemplates a surface (e.g., the surface 204 of FIGS. 2-3) that is generally orthogonal to the ion beam 112 of FIG. 1 as having minimal surface roughness requirements, while having very good thermal transport properties in order to reduce thermally induced surface erosion. A surface that is at shallow angle with respect to the ion beam 112, however, may have a higher surface roughness for film retention, while also having good electrical conductivity to mitigate or prevent surface charging and either deflection of the ion beam or micro-discharges arising from the beam potential passing close to the insulating surface.

Figure 4:
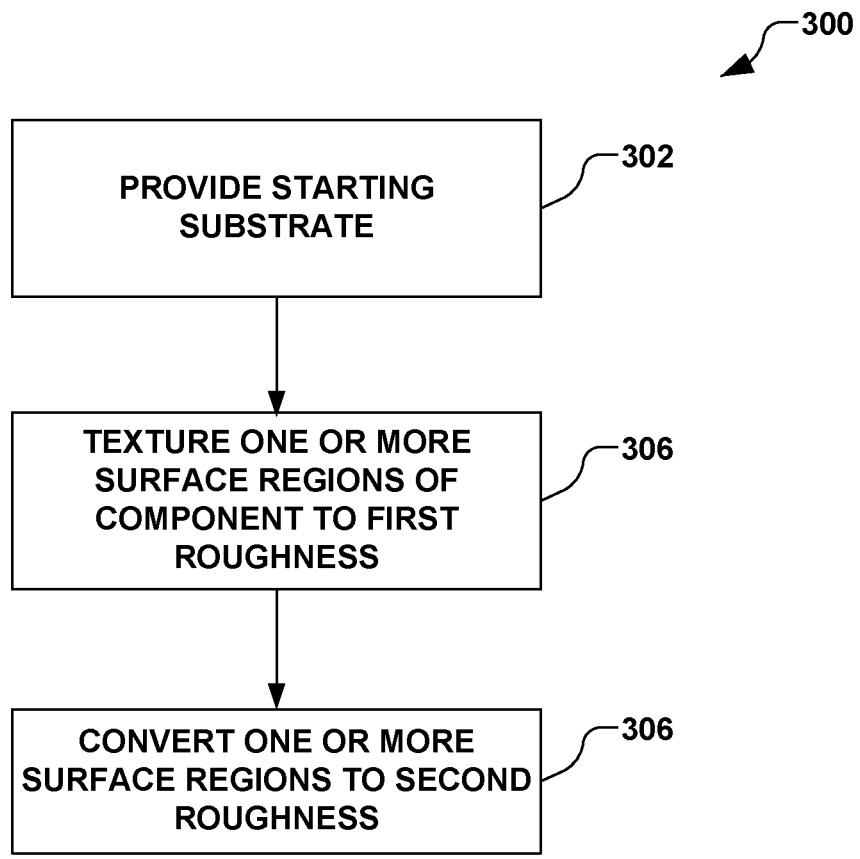
FIG. 4 is an exemplary method for forming a component for an ion implantation system.

In another aspect of the disclosure, FIG. 4 illustrates a method 300 for mitigating a deposition of a film on one or more components of an ion implantation system. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

The method 300 shown in FIG. 4 illustrates providing a starting substrate for one or more components for an ion implantation system in act 302. The starting substrate, for example, may comprise a carbon-based substrate, such as a graphite substrate. In act 304, one or more regions of a surface of the substrate are macroscopically textured, such as by mechanical, chemical, electrical, or any other texturing processes. A mask or other means may be used to selectively macroscopically texture the surface of the substrate. One example method of texturing graphite uses a specialized end-mill cutter to machine a pattern of closely-spaced narrow grooves (e.g., approx. 0.1 mm wide by 0.1 mm deep, with 0.5 mm spacing between grooves) across selected surfaces. Another example method uses grit blasting of the graphite component, while using a physical mask placed over the areas of the component not to be struck by grit blast media.

In act 306, the surface of the substrate is further microscopically textured. The surface may be microscopically textured, for example, by a high temperature and high pressure conversion process or other process. A silicon- and/or carbon-based substrate may be utilized in act 306. In one example, no defined interface layer is present between the microscopically textured surface and the remainder of the substrate, thus advantageously increasing a stability of the surface, due to the enhancement of thermal and electrical conductivity to the bulk material. This is in contrast, for example, to materials with densified graphite layers or deposited layers, which have well-defined buried interfaces that substantially prevent effective thermal and electrical conduction.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. A component for an ion implantation system, the component comprising a carbon-based substrate having a microscopically textured surface overlying a macroscopically textured surface, wherein the macroscopically textured surface comprises a mechanically roughened surface having a machined pattern of narrow grooves.

2. The component of claim 1, wherein the microscopically textured surface comprises a chemically converted surface.

3. The component of claim 1, wherein the component is positioned in a near-wafer environment is downstream of an angular energy filter.

4. The component of claim 3, wherein the near-wafer environment is downstream of an angular energy filter and within approximately 10 cm of a workpiece plane associated with the workpiece.

5. The component of claim 1, wherein the component comprises one of a dose cup, exit aperture, and a tunnel wall.

6. The component of claim 1, wherein there is no defined interface layer between the microscopically textured surface and macroscopically textured surface.

7. The component of claim 1, wherein the microscopically textured surface comprises a converted surface.

8. The component of claim 7, wherein the converted surface is formed by a chemical reaction forming a non-stoichiometric silicon and carbon surface.

9. The component of claim 1, wherein the carbon-based substrate comprises graphite.

10. The component of claim 9, wherein the microscopically textured surface comprises a modified graphite (MG) surface.

11. The component of claim 10, wherein the carbon-based substrate is selected based on a final porosity and grain size of the graphite.

12. A method for forming a component for an ion implantation system, the method comprising:
providing a carbon-based substrate having a surface;
selectively macroscopically texturing one or more regions of the surface of the substrate by machining a pattern of narrow grooves in the one or more regions of the surface; and
microscopically texturing the surface of the substrate after macroscopically texturing the one or more regions of the surface of the substrate.

13. The method of claim 12, wherein the microscopically texturing the surface comprises a chemically converting all of the surface.

14. The method of claim 12, wherein the carbon-based graphite is selected based on a final porosity and grain size of the graphite.

15. The method of claim 12, wherein the component comprises one or more of a dose cup, exit aperture, and a tunnel wall.

16. The method of claim 12, wherein microscopically texturing the surface comprises forming a modified graphite (MG) surface.

17. The method of claim 12, wherein microscopically texturing the surface comprises a chemical reaction forming a non-stoichiometric silicon and carbon surface.

18. The component of claim 1, wherein the machined pattern of narrow grooves have dimensions on the order of approximately 0.1 mm wide by 0.1 mm deep and spaced approximately 0.5 mm apart.

19. The method of claim 12, wherein the pattern of narrow grooves have dimensions on the order of approximately 0.1 mm wide by 0.1 mm deep and spaced approximately 0.5 mm apart.

20. The method of claim 12, wherein selectively macroscopically texturing the one or more regions of the surface of the substrate further comprises applying a mask over areas of the component not within the one or more regions of the surface and grit blasting the surface.

* * * * *